United States Patent

Ogura

[11] Patent Number: 5,290,081
[45] Date of Patent: Mar. 1, 1994

[54] CHIP MOUNTER
[75] Inventor: Naoyuki Ogura, Shizuoka, Japan
[73] Assignee: Tenryu Technics Co., Ltd., Shizuoka, Japan
[21] Appl. No.: 906,796
[22] Filed: Jun. 30, 1992
[30] Foreign Application Priority Data Jul. 1, 1991 [JP] Japan .................... 3-160268

[51] Int. Cl.⁵ .................................. B25J 15/06
[52] U.S. Cl. ...................... 294/64.1; 901/40; 29/743
[58] Field of Search ............ 294/2, 64.1, 66.2, 907; 901/40, 46, 47; 29/743; 414/737, 752

[56] References Cited

U.S. PATENT DOCUMENTS

| | | | |
|---|---|---|---|
| 4,281,342 | 7/1981 | Ueda et al. | 901/47 X |
| 4,651,203 | 3/1987 | Peterson | 901/47 X |
| 4,675,993 | 6/1987 | Harada | 29/743 X |
| 4,752,682 | 6/1988 | Beck et al. | 901/47 X |
| 4,909,376 | 3/1990 | Herndon et al. | 901/47 X |
| 4,973,216 | 11/1990 | Domm | 901/47 X |
| 5,018,936 | 5/1991 | Izumi et al. | 901/47 X |
| 5,033,783 | 7/1991 | Izumi et al. | 294/64.1 |

FOREIGN PATENT DOCUMENTS 2-36598  2/1990  Japan ..................... 29/743
3-22598  1/1991  Japan ..................... 29/743

Primary Examiner—David M. Mitchell
Assistant Examiner—Dean J. Kramer

[57] ABSTRACT

A chip mounter provided with an image processing system for recognizing as an image a chip sucked by a suction bit, the tip surface side of the suction bit being formed of a material which does not cause an erroneous image recognition of the image of the chip by the image processing system.

3 Claims, 2 Drawing Sheets

CHIP MOUNTER

BACKGROUND OF THE INVENTION

1. Field of the Invention

The present invention relates to a chip mounting technique, and more particularly to a technique which can be used effectively for mounting chip type electronic parts such as semiconductor pellet.

2. Related Art Statement

Typically, chip parts such as chip type electronic parts including semiconductor devices, resistors and capacitors are sucked with a suction bit of a chip mounter and then mounted onto a lead frame etc.

For example, as a chip mounter used in such a mounting technique, a chip mounter which is provided with an image processing system for recognizing as an image a chip sucked by a suction bit has been well known.

A chip mounter with such an image processing system recognizes whether a chip is sucked in a predetermined proper position of a suction bit or not by the image processing system. If the chip is not sucked at a predetermined proper position, the position is adjusted to the predetermined position of the chip based on a resultant image recognition by the image processing system.

Now, in the aforementioned chip mounter provided with an image processing system, the periphery of the suction bit is recognized as a background of a chip by the image processing system, and is formed with milk-white semitransparent resin and the like. Thereby, illumination light from a light emitting diode and the like permeates the resin and then strikes into an optical lens of the image processing system.

However, since at least the tip surface side, i.e. suction surface side of the suction bit, is formed of a metal, when the suction bit sucks the chip while its tip surface side is positioned within a chip surface to be sucked, the image processing system can recognize properly the chip as a proper image. However, when the suction bit sucks the chip while its tip surface side deviates from the chip surface area to be sucked, the image processing system recognizes the tip surface side of the suction bit as a dark shaded image which is the same as that produced by the chip.

As a result, the image processing system may recognize erroneously the shape image of the chip, whereby there is a danger that adjusting the position of a chip based on the image recognition by the image processing system becomes impossible.

SUMMARY OF THE INVENTION

An object of the present invention is to provide a chip mounter which can perform certainly an image processing work using an image processing system.

A chip mounter according to the present invention is provided with an image processing system which can recognize a chip sucked on a suction bit as an image, and the tip surface side, i.e. suction surface side of the suction bit is made of a material which does not lead the image processing system to an erroneous image recognition of a chip.

In this case, the chip mounter can be made to have a structure in which the brightness of the tip surface side of the suction bit and that of the periphery of the suction bit recognized as a background of a chip by the image processing system are such that the image processing system recognizes the tip surface side and the periphery of the suction bit as a substantially uniform image.

Also, the tip surface side and the periphery of the suction bit can be formed of a material which has transparent characteristics and reflects incident light.

Furthermore, the tip surface side and the periphery of the suction bit can be formed of the same material.

In addition, the material may be of a milk-white and semitransparent color.

Further, the chip mounter can be made so that the positioning of a chip is adjusted based on an image recognition of the chip obtained by the image processing system.

According to the chip mounter of the present invention, since the tip surface side of a suction bit is formed of a material which can prevent an erroneous image recognition of a chip by the image processing system, even when the tip surface side of the suction bit sucks a chip deviating from the chip surface area to be sucked, the image processing system can effectuate reliably an image processing without recognizing erroneously the image of a chip type.

In this case, if the brightness of the tip surface side of the suction bit and that of the periphery of the suction bit are recognized substantially uniformly by the image processing system, it can be prevented that the image processing system recognizes erroneously an image of a chip, whereby an image recognition can be performed reliably by the image processing system.

The advantages can be obtained more certainly by forming the tip surface side and the periphery of the suction bit with a material which has transparent characteristics and incident light reflection characteristics.

Furthermore, if the tip surface side and the periphery of the suction bit are formed of the same milk-white colored and semitransparent material, it can be manufactured easily and simply.

BRIEF DESCRIPTION OF THE DRAWINGS

The above and other objects and features of the present invention will become more apparent when referred to the following descriptions given in conjunction with the accompanying drawings, wherein like reference numerals denote like elements, and in which.

DETAILED DESCRIPTION OF THE PREFERRED EMBODIMENT

Figure 1:
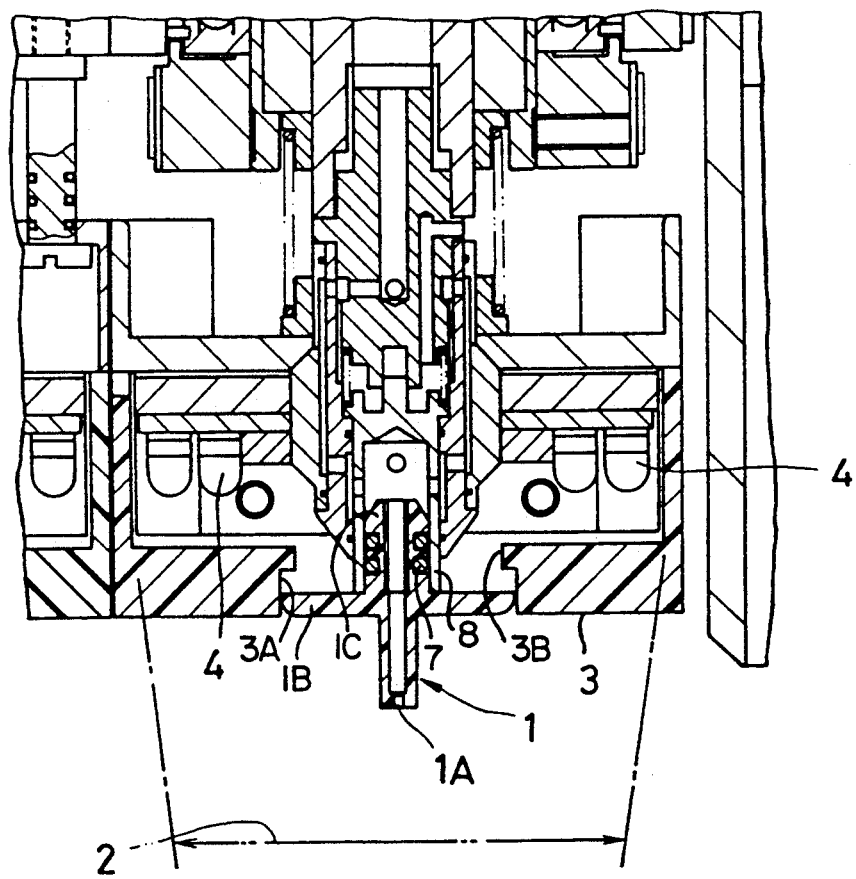
FIG. 1 is a partial cross sectional view of a chip mounter which is an embodiment of the present invention.

Referring to the drawings, a chip mounter according to the present invention is provided with an image processing system (not shown) which detects a position of a chip by recognizing as an image a chip (not shown) sucked to a suction bit 1 with a vacuum suction opening 1A.

The suction bit can be made to move vertically and in other directions by means of a given drive source (not shown). Through the vertical and other movements of the suction bit 1, a chip, i.e. chip type electronic part such as semiconductor device, resistor and capacitor is sucked, and then carried and mounted onto a predetermined member such as a lead frame.

An illumination lamp 4 composed of, for example, a light emitting diode or the like is arranged on the back side of the image recognition area of the image processing system, the area including the whole suction bit 1 and a background member 3 provided in the periphery of the suction bit 1.

The suction bit 1 and the background member 3 are made as separate bodies. The suction bit 1 is provided with a flange 1B at the intermediate portion of the axial length of the suction bit 1. The flange 1B is inserted into an opening 3A of the background member 3.

The suction bit 1 is also provided with a pair of O rings 7 at the base portion 1C thereof. The O rings 7 can fix and seal the suction bit 1 to a holder 8 of the chip mounted when the base portion 1C is inserted into the holder 8. By this construction, the suction bit 1 can be easily inserted and fixed to the holder 8 separately with the background member 3, even if it is desired to change the suction bit 1 to a new one, for example, when the size of a chip is changed.

Further, the background member 3 has annular eaves 3B at the upper end of the opening 3A. The annular eaves 3B extend toward an inside of the opening 3A to be overlapped with an outer periphery of the flange 1B of the suction bit 1 in order to cover interspace between the outer periphery of the flange 1B of the suction bit 1 and an inner wall surface of the opening 3A of the background member 3.

The whole suction bit 1 and the background member 3 are formed of the same material such as a milk white color semitransparent resin by which light from an illumination lamp 4 passes and by which incident light is reflected.

In such a structure, the image processing system can recognize substantially as a uniform image the brightness of the tip surface side of the suction bit 1 and the brightness of the surface side of the background member 3 which is image-recognized as a background against a chip. As a result, the tip surface side of the suction bit 1 does not cause an erroneous image recognition by means of the image processing system.

Figure 3:
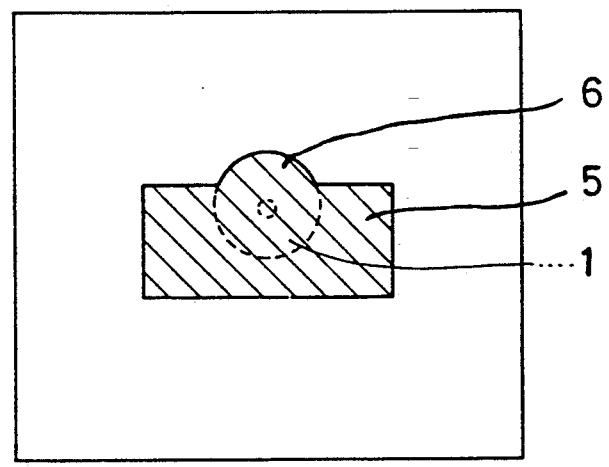
FIG. 3 is an explanatory view showing an image of a chip which is recognized as an image by a conventional image processing system.

In a conventional chip mounter, at least a tip surface side of a suction bit 1 is formed of a metal, and therefore, when the tip surface side of the suction bit 1 sucks a chip deviating from a chip surface area to be sucked as shown in FIG. 3, the image processing system recognizes the tip surface side of the suction bit 1 as a dark shade 6 similarly to that of the image 5 of the chip. As a result, there is a danger that the image processing system recognizes erroneously the image of the chip.

Figure 2:
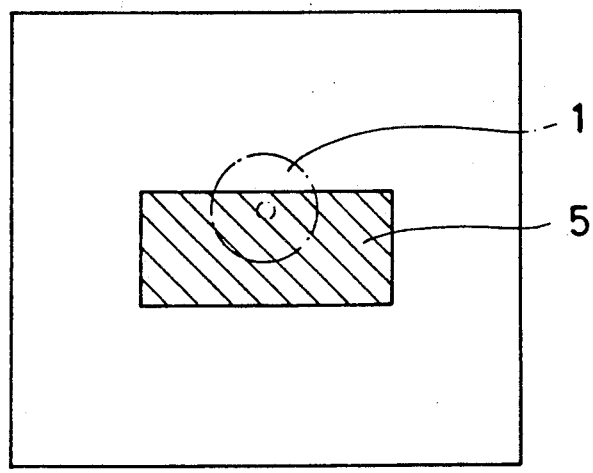
FIG. 2 is an explanatory view showing an image of a chip which is recognized as an image by an image processing system in the chip mounter of FIG. 1.

On the contrary, in the chip mounter according to the present invention, the image processing system recognizes substantially as a uniform image the brightnesses of both the tip surface side of the suction bit 1 and the surface side of the background member 3 recognized as the background of a chip by the image processing system. Hence, for example, as shown in FIG. 2, even if the tip surface side of the suction bit 1 sucks a chip deviating from a chip suction area to be sucked, there is no possibility that the image processing system recognizes erroneously the chip's image 5 due to the presence of the suction bit 1. As a result, the image processing system can process an image reliably.

As described above, the present invention has been explained referring to the embodiment. However, the present invention should not be restricted to the above-described embodiment, and it is apparent that various modifications can be made without departing from the scope of the invention.

Chip type electronic parts including semiconductor devices, resistors, capacitors, and the like have been referred to in the above embodiment. However, electronic parts used in the present invention should not be limited to such parts. For example, it is applicable to use chips formed in arbitrary shapes.

(1) According to the chip mounter of the present invention, the tip surface side of the suction bit is formed of a material which does not lead an image processing system to an erroneous image recognition of a chip. Therefore, even in the case that the tip surface side of the suction bit sucks a chip deviating from a chip surface area to be sucked, there is no danger that the image processing system recognizes erroneously the image of the chip owing to the deviated suction bit. Hence, reliable image recognition with an image processing system is attained.

(2) Further, when the image processing system recognizes substantially as a uniform image both the brightnesses of the tip surface side of the suction bit and the periphery recognized as a background image of the chip by the image processing system, performing an erroneous recognition of a chip shape by the image processing system is prevented. As a result, image recognition can be effectuated reliably with the image processing system.

In the case that the tip surface side of the suction bit and the periphery of the suction bit are formed of a material which has light transparent characteristics and reflects incident light, the above mentioned effect can be obtained more certainly.

(3) Further, if the tip surface side of the suction bit and the periphery side of the suction bit are formed of the same milk-white and semitransparent material, easiness and simplification in manufacturing is attained.

What is claimed is:

1. A chip mounter, comprising:
    a suction bit having a vacuum suction opening;
    a background member provided in a periphery of said suction bit; and
    an illumination lamp arranged on the back side of said suction bit and background member,
    said suction bit and background member being made of the same material through which light emitted from said illumination lamp passes and by which incident light is reflected,
    said suction bit and background member being formed as separate bodies, said suction bit having a flange inserted into an opening of said background member, and
    said opening of said background member having annular eaves extending toward an inside of said opening of said background member to be overlapped with an outer periphery of said flange of said suction bit in order to cover interspace between said outer periphery of said flange of said suction bit and an inner wall surface of said opening of said background member.

2. The chip mounter according to claim 1, wherein:
    said suction bit has a base portion inserted into a holder, and said suction bit is fixed to the holder by at least one O ring.

3. The chip mounter according to claim 1, wherein:
    said suction bit and background member are made of a milk-white semitransparent material.

* * * * *